(12) United States Patent
Dalvi

(10) Patent No.: US 7,138,829 B1
(45) Date of Patent: Nov. 21, 2006

(54) MEASURING INPUT SETUP AND HOLD TIME USING AN INPUT-OUTPUT BLOCK HAVING A VARIABLE DELAY LINE

(75) Inventor: Ajay Dalvi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 199 days.

(21) Appl. No.: 10/990,032

(22) Filed: Nov. 16, 2004

(51) Int. Cl.
*H03K 19/177* (2006.01)
*H03K 19/00* (2006.01)

(52) U.S. Cl. .......................... 326/41; 326/93; 327/141

(58) Field of Classification Search ............ 326/38–41, 326/46, 93
See application file for complete search history.

(56) References Cited

U.S. PATENT DOCUMENTS

| | | | |
|---|---|---|---|
| 6,233,205 B1 | 5/2001 | Wells et al. | |
| 6,239,611 B1 | 5/2001 | Matera | |
| 6,564,360 B1* | 5/2003 | Chiu | 716/6 |
| 6,734,703 B1 | 5/2004 | Alfke et al. | |
| 6,771,099 B1* | 8/2004 | Cavazos et al. | 327/141 |

OTHER PUBLICATIONS

U.S. Appl. No. 10/990,045, filed Nov. 16, 2004, Dalvi.
Xilinx, Inc.; Virtex 4 User Guide; (v1.1); Sep. 10, 2004; available from Xilinx, Inc., 2100 Logic Drive, San Jose, California 95124; pp. 19-43.

* cited by examiner

*Primary Examiner*—James H. Cho
(74) *Attorney, Agent, or Firm*—Scott Hewett

(57) ABSTRACT

A system and method for measuring the timing requirements of a sequential logic element of a programmable logic device. The sequential logic element has a first data terminal, an output terminal, and a clock terminal. A first synchronous element is coupled to the data terminal through a first delay element. The first synchronous element is clocked by a clock signal and receives an alternating test signal. A second synchronous element is coupled to the clock terminal through a second delay element of an input-output block. The second synchronous element is also clocked by the clock signal and receives the alternating test signal. The output terminal of the sequential logic element is monitored by a tester or by logic configured in the fabric of the programmable logic device to determine when the logic state changes as the delay of the first or second delay element is selectively varied.

17 Claims, 6 Drawing Sheets

MEASURING INPUT SETUP AND HOLD TIME USING AN INPUT-OUTPUT BLOCK HAVING A VARIABLE DELAY LINE

FIELD OF THE INVENTION

The present invention relates generally to digital logic devices, and more particularly to measuring the setup and hold time of a sequential logic element.

BACKGROUND OF THE INVENTION

Digital electronic logic devices, such as microprocessors, field-programmable gate arrays ("FPGAs"), complex logic devices ("CPLDs"), and application-specific integrated circuits ("ASICs") use a digital clock signal to synchronize operations of different portions of the logic device. Generally, the digital clock signal enables logic and memory cells to read and write data at the appropriate times.

"Set-up time" and "hold time" describe the timing requirements on the data input of a sequential logic element, such as a flip-flop or register, with respect to a clock input. The set-up and hold times define a window of time during which data must be stable to guarantee predictable performance over a full range of operating conditions and manufacturing tolerances.

A positive set-up time describes the length of time that the data must be available and stable before the active clock edge. A positive hold time describes the length of time that the data to be clocked into the flip-flop must remain available and stable after the active clock edge.

Hold-time requirements between flip-flops on the same chip can be avoided by careful design of the on-chip clock distribution network. However, a more difficult problem arises with input flip flops, with respect to the device clock input pin. When specifying the data pin-to-clock pin set-up and hold times, the chip-internal clock distribution delay must be taken into consideration. The internal clock delay retards the clock edge at the input flip, which may require the data source to hold the data values longer. This limits the speed at which the data source can transfer data to the sequential logic element.

FIG. 1 illustrates three clock-to-data timing relationships used to describe the relationships between setup time, hold time, and a clock edge. Referring to the first example, the set-up time ("SUT") is the length of time that data must be available and stable before the arrival of a clock edge 100. The hold time ("HT") is the length of time that data to be clocked into the logic element must remain stable after the arrival of clock edge 100. Set-up times limit the maximum clock rate of a system. Positive hold times can cause malfunctioning at any clock rate. Thus, chip designers strive to provide zero or negative hold-time requirements.

The second example in FIG. 1 illustrates the input and output signals of a flip-flop that meets a zero-hold-time requirement. The data, a logic one at the onset of rising edge 110, propagates through the selected logic element to raise the output signal OUT to a logic one. The third example illustrates the input and output signals of a flip-flop that fails to meet a zero-hold-time requirement. The data, a logic one at the onset of rising edge 120, does not initiate the requisite logic one output signal OUT.

The time required for the output of a sequential logic element to change states in response to a clock is termed the "clock-to-out" delay. When two systems (e.g., two integrated circuits ("ICs")) communicate synchronously, the data source must guarantee a minimum clock-to-out delay if the receiving device has a positive hold-time requirement. IC manufacturers prefer to provide short clock-to-out delays, but may be unable or unwilling to guarantee some minimum clock-to-out delay to compensate for a positive hold-time requirement. Any input hold time requirement is, therefore, an invitation to system failure. For a more detailed discussion of clock-to-out delays, including methods of measuring them, see U.S. Pat. No. 6,233,205 to Wells et al., which is incorporated herein by reference.

FIG. 2 illustrates a conventional programmable input block 200 that addresses potential hold-time problems. (Input block 200 is part of an input/output block on a XILINX XC4000 field-programmable gate array). Input block 200 includes an input buffer 205, a programmable delay circuit 210, a sequential logic element 215, and three programmable multiplexers 220, 225, and 230. A programmable multiplexer 240 within delay circuit 210 can be programmed to insert none, one or both of delay elements 235 into the incoming data path to compensate for clock delays induced by relatively long signal paths in the clock distribution network. Multiplexer 230 includes both inverting and non-inverting inputs, allowing logic element 215 to clock on either positive or negative clock edges.

FIG. 3 depicts a conventional test configuration 300 for ensuring that a selected sequential storage element on a programmable logic device meets a zero-hold-time requirement. System 300 includes a conventional tester 305 connected to a field-programmable gate array (FPGA) 310. FPGA 310 is a well-known type of programmable logic device, and might be one of the VIRTEX™ series of FPGAs available from XILINX, INC., of San Jose, Calif. FPGA 310 includes an array of configurable logic blocks 311, or CLBS, that are programmably interconnected to each other and to programmable input/output blocks 312 (IOBs). This collection of configurable logic may be customized by loading configuration data into internal configuration memory cells that define how the CLBS, interconnections, and IOBs are configured. FPGA 310 additionally includes a clock distribution network 313 that can be connected to an external clock source (not shown) via eight global clock buffers 314 located in the four corners of FPGA 310. Each global clock buffer 314 has a corresponding pass transistor for gating an external clock signal to the input terminal of the respective clock buffer. For example, a pass transistor 315 selectively gates the signal on an input pin 325 through one of clock buffers 314 to clock distribution network 313. The signal on input pin 325 is additionally available to IOB 312B.

Clock distribution network 313 can be programmably connected to any of CLBs 311 or IOBs 312. In the depicted example, clock distribution network 313 connects input pin 325 to an input terminal of IOB 312A.

Tester 305 includes a pair of output leads 317 and 320 connected to respective input/output pins 325 and 330 of FPGA 310. Tester 305 also includes an input line 335 connected to an input/output pin 340 of FPGA 310. Tester 305 simultaneously applies input signals to pins 325 and 330 and monitors the output signal on line 335 to determine whether the correct data on line 320 clocks into IOB 312A. An incorrect logic level on line 335 indicates a hold-time violation.

Conventional test configuration 300 fails to provide acceptable levels of accuracy because tester 305 is typically too imprecise to effectively measure set-up and hold times. For example, while tester 305 may be able to place edges with nanosecond precision, set-up and hold times in leading-edge processes can be much shorter, e.g. a few tenths of a nanosecond.

Systems and methods have been proposed for quickly and accurately testing sequential logic elements on programmable logic devices for zero-hold-time compliance. See, for example, U.S. Pat. No. 6,239,611, issued to Michael M. Matera on May 29, 2001, entitled "Circuit and Method for Testing Whether a Programmable Logic Device Complies With a Zero-Hold-Time Requirement," which is incorporated herein by reference. In that example, a programmable logic device is configured such that both the data and clock terminals of a selected sequential logic element connect to an input pin of the programmable logic device, and the output terminal of the sequential logic element connects to an output pin of the programmable logic device. A circuit tester connected to the input pin then generates a signal transition on the input pin so that the signal transition traverses the data and clock paths in a race to the sequential logic element. The circuit tester also includes an input terminal that monitors the PLD output pin to determine whether the logic element contains the correct data after the logic element is clocked. Incorrect data stored in the sequential logic element after the logic element is clocked indicates that the clock signal arrived too early, and therefore that the logic element violated the zero-hold-time requirement in the specified configuration.

The above-described method is a specialized, easily implemented go/no-go test that works well to test for zero hold time compliance. However, the method does not work on all architectures, and does not provide a measure of set-up time.

Another technique for analyzing timing characteristics of sequential logic elements is described in U.S. Pat. No. 6,734,703 issued to Alfke et al. on May 11, 2004, which is incorporated herein by reference. A digital clock manager ("DCM") having a delay-locked loop is used to impose delay on an input clock signal. A variable delay circuit places the edges of the test clock signal at different times relative to corresponding edges on test signals. The worst-case set-up and hold time requirements for a flip-flop are determined by varying the delay between the clock and data edges.

Generally, the variable-delay circuit in the DCM is initially set so that the output of the flip-flop is always high (a digital "1"), and is gradually adjusted to reduce the clock delay until the flip-flop goes low (produces a digital "0"). The delay setting at which a logic zero is first captured is the measured set-up time.

Next, the delay through the variable delay tester is reduced to zero delay, typically producing a high value at the Q output of the flip-flop. As the delay is increased, O-bar from the flip-flop will eventually go high for the first time. However, this technique uses the DCM in the clock path (in order to utilize the digital phase shifter in the DCM). In some applications, it is desirable to characterize set-up and hold times without the DCM in the clock path. Similarly, in some cases a DCM might produce jitter on the output clock signal that creates measurement uncertainty when determining set-up and hold times. Finally, in some FPGAs, such as in a VIRTEX IV™ FPGA, regional clocks are used. The DCM is not a suitable programmable delay element for measuring set-up and hold times of a sequential logic device clocked by a regional clock.

Thus, it is desirable to be able to perform set-up and hold time measurements without using a DCM as a variable delay element.

SUMMARY OF THE INVENTION

The present invention is directed to a system and method for measuring the timing requirements of a sequential logic element of a programmable logic device. In one embodiment, the sequential logic element has a first data terminal, an output terminal, and a clock terminal. A first synchronous element is coupled to the data terminal of the sequential logic element through a static delay element. The first synchronous element is clocked by a clock signal and receives an alternating test signal at a data terminal. A second synchronous element is coupled to the clock terminal of the sequential logic element through a selectively variable delay element of an input-output block. The second synchronous element is also clocked by the clock signal and receives the alternating test signal at a data terminal of the second synchronous element. A catch output port is connected to the output terminal of the sequential logic element. The logic state of the output terminal is monitored at the catch output port by a tester or by logic configured in the fabric of the programmable logic device.

DETAILED DESCRIPTION OF THE DRAWINGS

Figure 1:
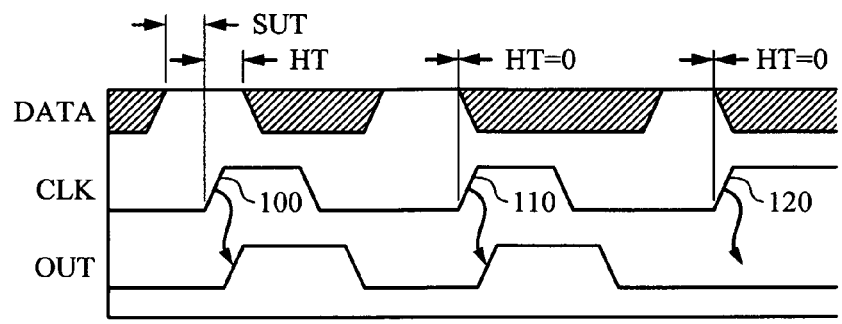
FIG. 1 (prior art) illustrates three clock-to-data timing relationships between set-up time, hold time, and a clock edge.
Figure 2:
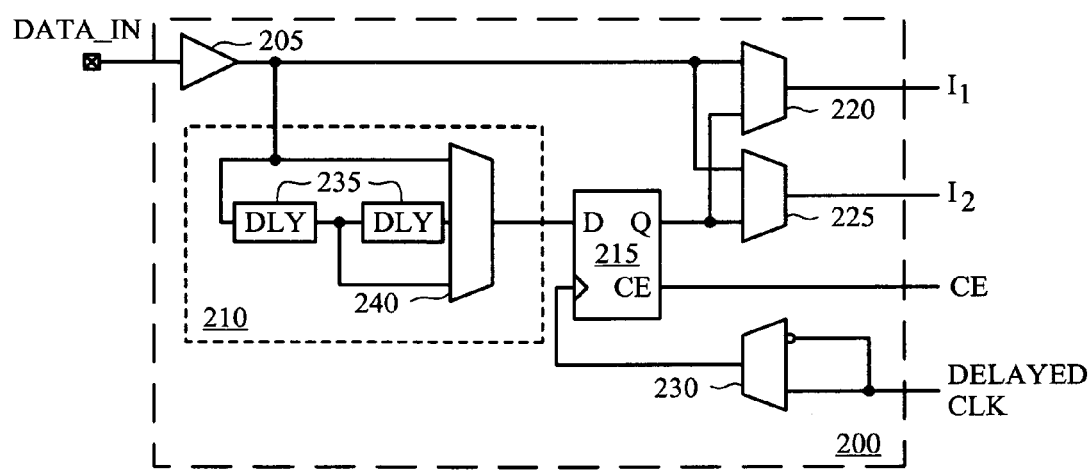
FIG. 2 (prior art) illustrates a conventional programmable input block that addresses potential hold-time problems.
Figure 3:
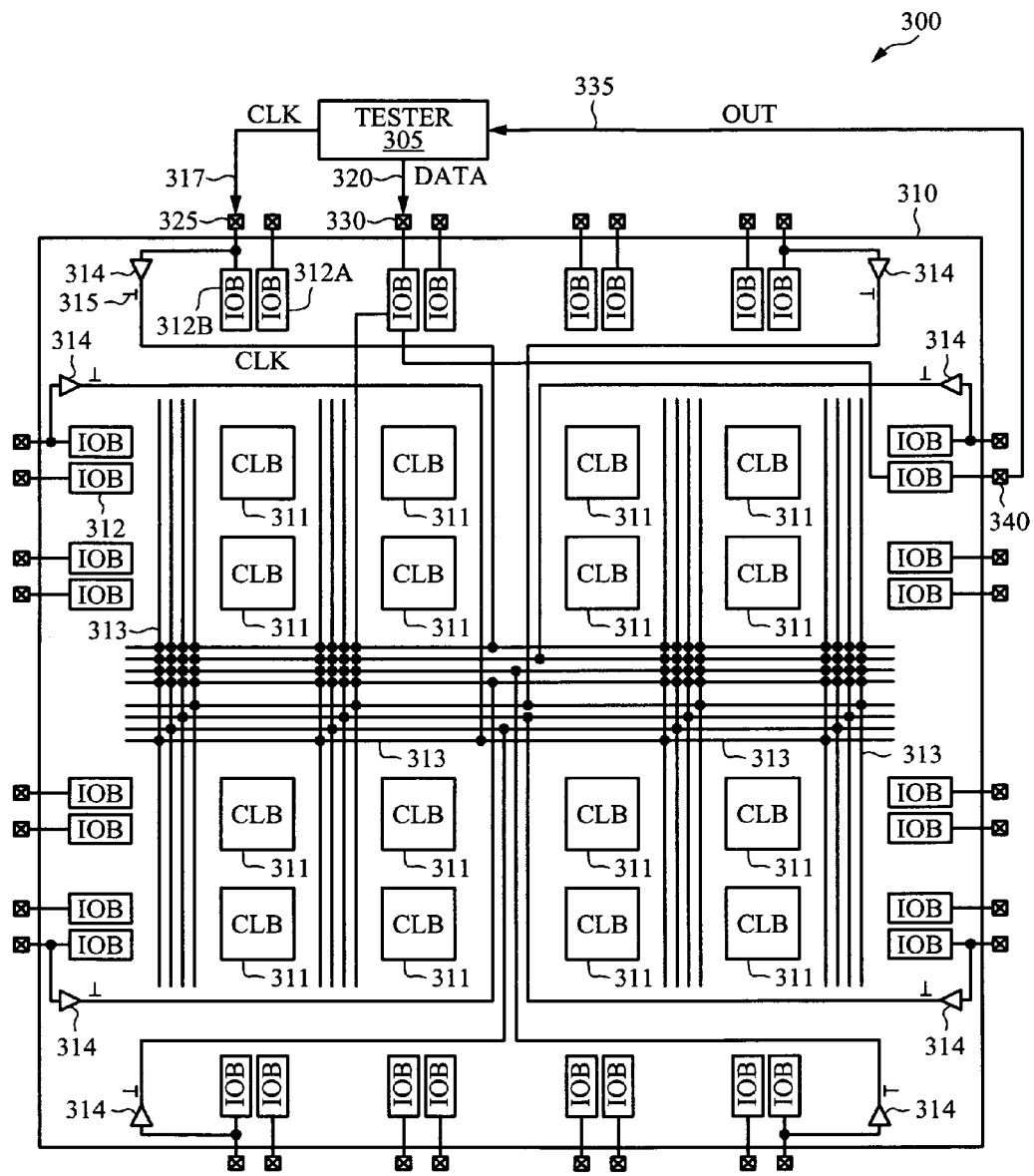
FIG. 3 (prior art) depicts a conventional test configuration for ensuring that a selected sequential logic element on a programmable logic device meets a zero-hold-time requirement.
Figure 4A:
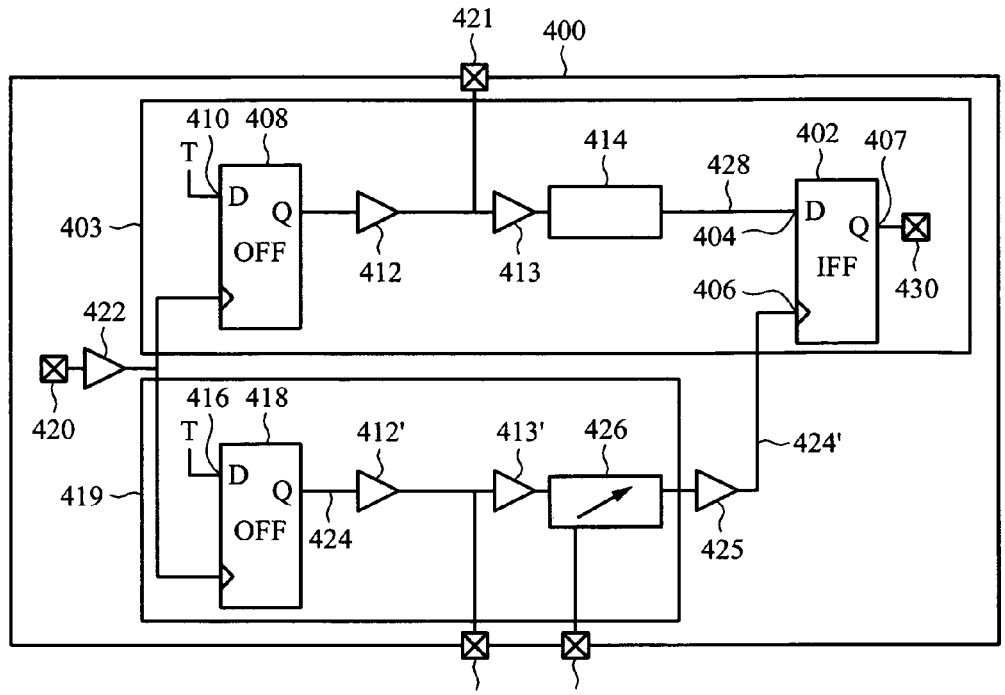
FIG. 4A depicts portions of an FPGA configured in accordance with an embodiment of the invention.

FIG. 4A depicts portions of an FPGA 400 configured in accordance with an embodiment of the invention to measure set-up and hold time of a sequential logic element 402, such as an input flip-flop ("IFF") inside a first IOB 403. The abbreviation "IFF" is used below to designate the sequential logic element for convenience and simplicity of illustration, and does not limit the sequential logic element to an IFF. The IFF 402 has a data terminal 404, a clock terminal 406, and an output terminal 407. The data terminal 404 receives an alternating test signal composed of a series of rising and falling signal edges from a first synchronous element, such as an output flip-flop ("OFF"), 408 that is also in the first IOB 403. The OFF is an edge-triggered D flip-flop that passes the D input on a clock edge, and is alternatively any type of synchronous element. Toggle data (i.e. an alternating test signal) "T" is provided to the data terminal 410 of the first synchronous element 408, and then through an output buffer 412 and input buffer 413 to a static delay element 414 inside the first IOB 403. The static delay element is a programmable delay element that is not stepped or swept during the set-up and hold measurement. Alternatively, the static delay element is a fixed delay element; however, having a programmable delay element in the IOB 403 with the IFF 402 allows holding the clock timing constant while varying the data timing to determine set-up and hold times (see FIG. 4B and associated written description). The static delay element 414 might have a legacy delay insuring a zero hold time for the IFF 402 based on an expected delay on the clock path, for example.

The layout and design of the FPGA 400 allows essentially the same toggle data to be provided to the data terminal 416 of a second synchronous element, such as a second OFF, 418 in a second IOB 419. Similarly, the clock signal arrives at both synchronous elements 408, 418 at essentially the same time. In a particular embodiment, the toggle data is a divided global clock signal, such as a one-half global clock signal. Careful routing of the toggle data and clock signal to both synchronous elements 408, 418 allows both synchronous elements 408, 418 to transfer data at the same time.

The test signal is clocked by a clock signal provided at a sample clock port ("ports" are often also commonly called "pads") 420. The clock signal is buffered by a first global clock buffer 422, and distributed to the first OFF 408 and to the second OFF 418. In one embodiment, the sample clock signal is a global clock signal provided by an external clock source (e.g. a tester) or by an internal ("on-chip") global clock source, such as a clock recovery circuit, or is a regional chip-based clock signal. Regional clocks are desirable when using source-synchronous clock signals. More information on regional clocks is found in the Virtex-4 User Guide (v1.1)(Sep. 10, 2004), available from Xilinx, Inc. of San Jose, Calif., which is incorporated herein by reference, particularly pages 19–43.

It is particularly desirable to use a programmable delay line that is not in the DCM (not shown) of an FPGA because the DCM output has a dedicated route to the global clock. Using the DCM to add delay to a regional clock signal for a set-up and hold measurement makes it much more difficult to match the clock paths to the OFFs 408, 418 because the regional clock signal has to take an extra route through the DCM and global clock path.

The timing of toggle data provided to the first and second synchronous elements 408, 418 is essentially identical, and the timing of the clock signals provided to the first and second synchronous elements 408, 418 is also essentially identical. However, the output 424 of the second synchronous element 418 is selectively delayed by a selective variable delay element 426 before being buffered by a second clock buffer 425, which is a global clock buffer or a regional clock buffer outside the IOB 419, for example, and provided to the clock terminal 406 of the IFF 402.

The selective variable delay element 426 is programmable and provides a selected amount of delay to the output 424 of the second synchronous element 418 according to a delay control signal coupled to an input-output ("I/O") port 427. The I/O port 427 receives a number of signals for controlling the operation of the variable delay element 426 (see, e.g., FIG. 6, ref. nums. 604, 606, 608, 610, 612). The resolution of a digital variable delay element generally depends on the number of tap elements in the selective variable delay element. In one embodiment, a variable delay line in an IOB of a VIRTEX IV™ FPGA has about sixty-four tap elements. The resolution of the variable delay line is the clock period divided by the number of increments of phase shift (i.e. taps) provided by the variable delay line. In a particular embodiment, the selective variable control element is stepped (increased) on each clock cycle, thus providing a step-wise sweep of phase delay through the variable delay element 426.

The state of the IFF 402 is monitored at a catch output port 430. The catch output port is monitored by a tester coupled to the catch output port 430 through programmable interconnections of the FPGA 400, for example, or by logic configured in the fabric of the FPGA 400. Monitoring the catch output port 430 and knowing what the toggle data is indicates whether the IFF 402 has captured the expected data value.

In a particular embodiment, the static delay element 414 is programmed to provide a selected amount of delay. The amount of delay is selected so that the set-up and hold times occur when the variable delay element 426 adds sufficient delay to clock signal in its initial position. This allows the variable delay element 426 to further retard the clock signal, by routing the clock signal through additional taps (not shown), or to advance the clock signal from this initial condition, by routing the clock signal through fewer taps. In this manner, the variable delay element 426 is operated in conjunction with the static delay element 414 to selectively advance or retard the clock signal.

Figure 4B:
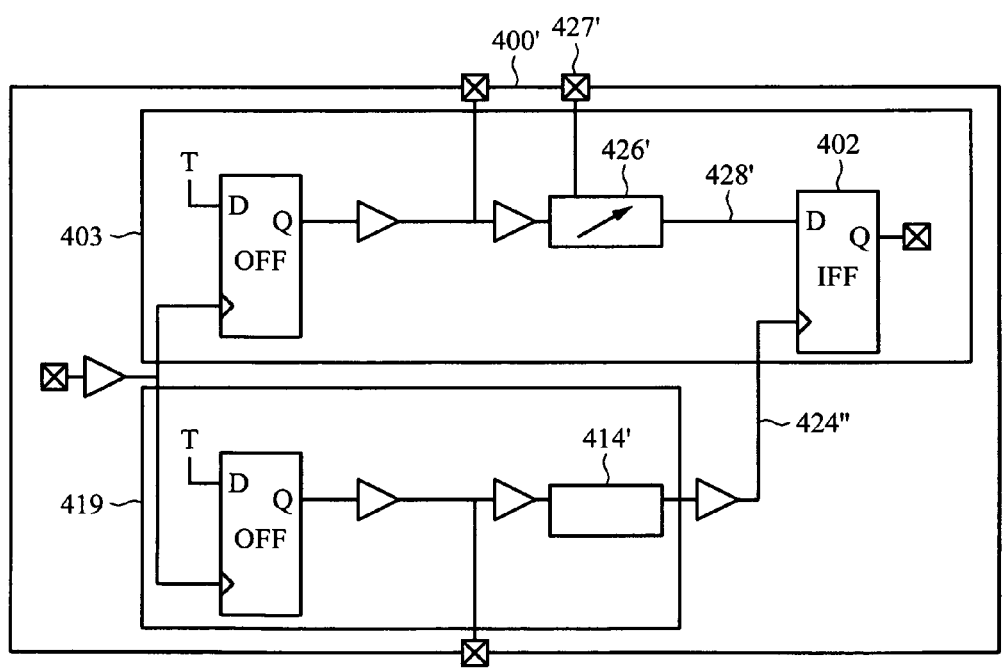
FIG. 4B depicts portions of the FPGA configured in accordance with another embodiment of the invention.

FIG. 4B depicts portions of the FPGA 400' configured in accordance with another embodiment of the invention. In this embodiment, the static delay element 414' in the second IOB 419 is in the path of the clock signal, which produces a modified, but static, input clock signal 424", and the variable delay element 426' in the first IOB 403 is in the path of the data signal, providing a modified (i.e. phase delayed) data signal. The delay control signal is coupled to I/O port 427' (see also, FIG. 6 and the associated written description). Measuring the set-up and hold time of the IFF 402 is similar to the techniques described in reference to FIG. 4A, except that the variable delay is inserted into the data path, rather than the clock path.

Figure 5:
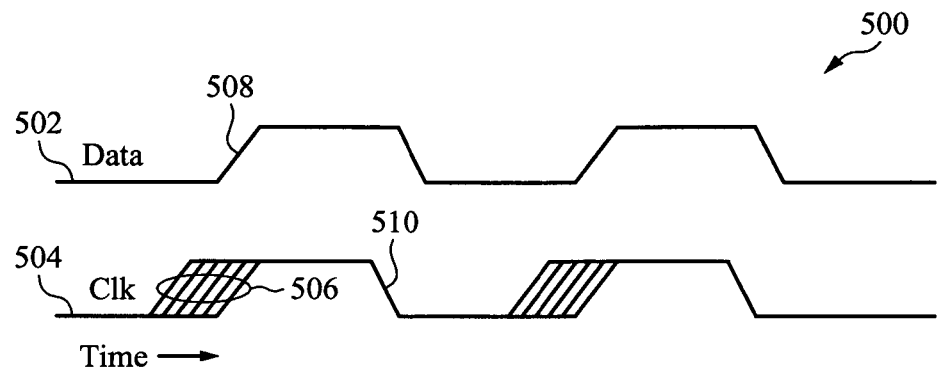
FIG. 5 is a timing diagram illustrating measuring set-up and hold time according to an embodiment of the invention.

FIG. 5 is a timing diagram 500 illustrating measuring set-up and hold time according to an embodiment of the invention. A first plot 502 represents a data signal, and a second plot 504 represents a clock signal. The clock signal is shown with multiple rising edges 506 to represent that the clock signal is selectively phase shifted with a delay element in an IOB, hence, the rising edge of the clock signal is selectively placed relative to the rising edge 508 of the data signal. Multiple falling edges of the phase-variable clock signal are omitted for clarity of illustration and only a single falling edge 510 is shown.

The following description is made in reference to FIGS. 4A and 5. In typical FPGAs, it is not possible to directly observe (e.g. with a high-speed oscilloscope) the data signal and the clock signal at their respective ports of the IFF 402. Rather than directly observing these signals, delay is added on clock path and the value present at the catch output port 430 is monitored. The measurement is calibrated by establishing a reference point without the variable delay element 426 in the clock path to the IFF 402.

When the set-up time is measured, the total delay in the clock path is the sum of the delay without the variable delay element and the delay added by the variable delay element. For example, if the clock path through the second IOB 419 bypassing the variable delay element 426 is 1 nano second ("nS") and the clock signal is routed through a single tap (not shown) of the variable delay element 426, which provides an additional 0.08 nS, the total delay in the clock signal is 1.08 nS. Thus, calibrating the clock path through the IOB without going through the variable delay element provides a more accurate indication of the set-up time.

The data path from the OFF 408 to the IFF 402 is within the first IOB 403. The clock path (i.e. the toggle data provided to the second OFF 418 and then to the clock port 406 of the IFF 402) exits the second IOB 419 and is routed through the FPGA 400. Routing the clock signal from the second IOB 419 to the IFF 402 in the first IOB 403 adds delay to the clock signal; hence, if no additional delay is added by the static delay element 414, the clock edge lags behind the data edge at the IFF 402. The delay added to the clock signal by the route from the second IOB to the IFF will be referred to as the "clock routing delay."

The clock and data edges are essentially aligned at the data and clock pads 421, 423. Since the clock edge arrives at the IFF 402 after the data pulse, and the data pulse has long duration, the data pulse is captured by the IFF 402. However, we do not yet know what the difference in skew between the data and clock signal paths to the IFF 402 is, namely what the clock routing delay is. The clock routing delay is what determines the necessary set-up and hold time for a data transmitter when it is sending data to the IFF 402.

It is possible to selectively program several paths from the second IOB 419 through the FPGA 400 to the clock port 406 of the IFF 402. In one embodiment, set-up and hold times are measured for both the shortest (in time) path and the longest (in time) path, providing best- and worst-case set-up and hold times for the IFF 402 being clocked by the second IOB 419.

A path is configured from the second IOB 419 through the buffer 425 to the IFF 402. In one embodiment, the delay from the data pad 421 through the static delay element 414 to the data port 404 of the IFF 402 is greater than the delay from the clock pad 423 to the clock port 406 when variable delay element 426 is programmed to provide zero additional delay. Since the data value is not present at the data port 404 when the clock edge occurs at the clock port 406, the data value is not captured by the IFF 402.

Delay is selectively added to the clock signal by programming the variable delay element 426 through the IO port 427, which retards the clock edge relative to the data edge, until a logic one of the data signal is passed through the IFF 402 to the catch output port 430 (i.e. until the clock edge and data edge line up at the IFF 402). The intrinsic set-up time of the flip-flop is typically on the order of a few picoseconds, and may be ignored in many cases, or alternatively is added into the measured set-up and hold times if the intrinsic set-up time has been measured or characterized. The intrinsic set-up time generally refers to the physical operation of the flip-flop capturing data, rather than skew arising from signal routing paths, and is typically designed to be essentially zero time.

At this condition, the delay from the data pad 421 through the static delay element 414 to the data port 404 of the IFF 402 (which is assumed to be essentially the total delay in the data path) equals the delay from the clock pad 423 through the variable delay element 426, which adds a known amount of delay, and the clock routing delay for the selected path configuration. Knowing the delay of the static delay element 414 provides the clock routing delay, which is the set-up and hold time for the selectively configured clock route.

Any of several suitable techniques are used to measure the delay of the static delay element, such as switching the static delay element into and out of the data path and characterizing the operation of the IFF using an external phase-shiftable data source and measuring the data and clock edges at the data and clock pads 421, 423, for example. Once the delay of the static delay element is known, the set-up times for several different clock route configurations can be measured. In other embodiments, the static delay element is a selectively variable delay element programmed to provide a known amount of delay.

Alternatively, the variable delay element is in the data path (see FIG. 4B) in the first IOB 403. The static delay element 414' is in the clock path in the second IOB 419. The static delay element 414' is set to a known value, such as zero additional delay, or alternatively is bypassed. In one embodiment, the delay through the static delay line is essentially equal to the delay through the variable delay line 426' when the variable delay line 426' is programmed to provide zero additional delay. Initially, the data edge is present at the IFF 402 before the clock edge because the clock signal has the clock routing delay. The data pulse is relatively wide, and is assumed to last much longer than the set-up time (clock routing delay), and the IFF 402 captures the data value because it is present when the clock edge arrives at the IFF 402. Delay is added to the data path until the catch output 430 indicates that the data was not captured, i.e., that the minimum set-up time condition has been reached. The amount of delay added to the variable delay line 426' indicates the set-up time for the selected clock route configuration.

In FIG. 5, the phase of the data signal is static and the skew of the clock signal 424' increased from an initial (non-captured data) condition, until the SETUP condition is met, and then is phase-shifted in the opposite direction until the HOLD condition is met. Alternatively, the clock signal is initially advanced from a condition where the data value is captured until the data value is not captured, and then retarded until the data value is captured again. Thus, the phase skew applied to the clock signal is applied first in one polarity, and then in the opposite polarity.

In a particular embodiment, a variable delay line in an IOB is essentially swept. Each clock edge skews the output of the digital delay line another increment and the logic value at the capture output port is monitored (e.g. by a tester or logic in the FPGA) to determine when set-up and hold conditions occur.

Figure 6A:
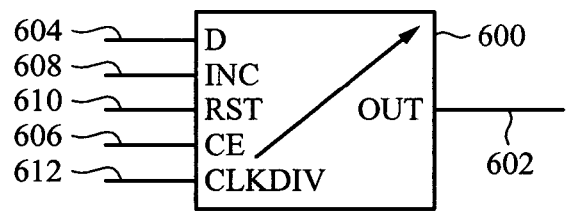
FIG. 6A is a diagram of a delay chain used as a delay line in an IOB.

FIG. 6A is a diagram of a delay chain 600 used as a delay line in an IOB. Delay chains according to FIG. 6A are implemented in versions of VIRTEX IV™ FPGAs, available from XILINX, INC., of San Jose, Calif. A signal is provided to the data input terminal 604 and output on a data output terminal 602 with a selected amount of delay. A clock signal is provided to a clock input terminal 612. A module reset terminal 610 resets the delay chain 600 to a selectable value of delay, and to zero if no selectable value of delay has been specified. The reset signal is an active-High reset and is synchronous to the input clock signal at the clock input terminal 612. An increment/decrement enable terminal 606 controls when an increment/decrement function is to be performed. As long as CE remains high, the delay chain 600 will increment or decrement by one tap unit (e.g. $\frac{1}{256}^{th}$ of the total available delay) every clock cycle. The state of the INC terminal 608 determines whether the delay is increased or decreased. For example, if INC=1, the delay is increased one unit on each clock cycle, and if INC=0, the delay is decreased one unit on each clock cycle, assuming CE 606 is enabled. In a particular embodiment, a clock signal at the rate of the input signal is coupled to the CE terminal 606 to sweep the delay from zero phase skew to the maximum phase skew available from the delay chain 600, and then the delay chain is reset to zero. Alternatively, the sweep of phase skew is terminated after the set-up and hold conditions have been determined, avoiding unnecessary test time. The terminals 604, 606, 608, 610, 612 are coupled to an I/O port to receive control signals from an external source, such as a tester (see FIG. 4A, ref. num. 427 and FIG. 4B, ref. num. 427'), or from the fabric of the FPGA.

Figure 6B:
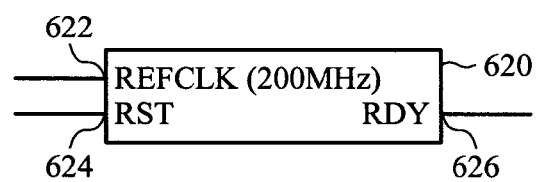
FIG. 6B is diagram of a delay control block used with the delay chain shown in FIG. 6A.

FIG. 6B is diagram of a delay control block 620 used with the delay chain shown in FIG. 6A. The delay control block has a reset input pin 624 that is an active-High asynchronous reset. The delay control block is reset after configuration to ensure proper operation of the delay chain (see FIG. 6A, ref. num. 600). A reference clock signal (e.g. 200 MHz clock signal) is provided to a reference clock terminal 622. The reference clock signal provides a time reference to calibrate the all delay chains in the same region of the FPGA, and is driven by a global clock buffer. The reference clock signal is supplied directly from a user-supplied source, or from the DCM, for example. A ready terminal 626 indicates when the delay chain in the specific region are calibrated. The ready signal is de-asserted if the reference clock is held High of Low for one clock period or more. If the ready signal is de-asserted Low, the delay control block 620 is reset.

Figure 7A:
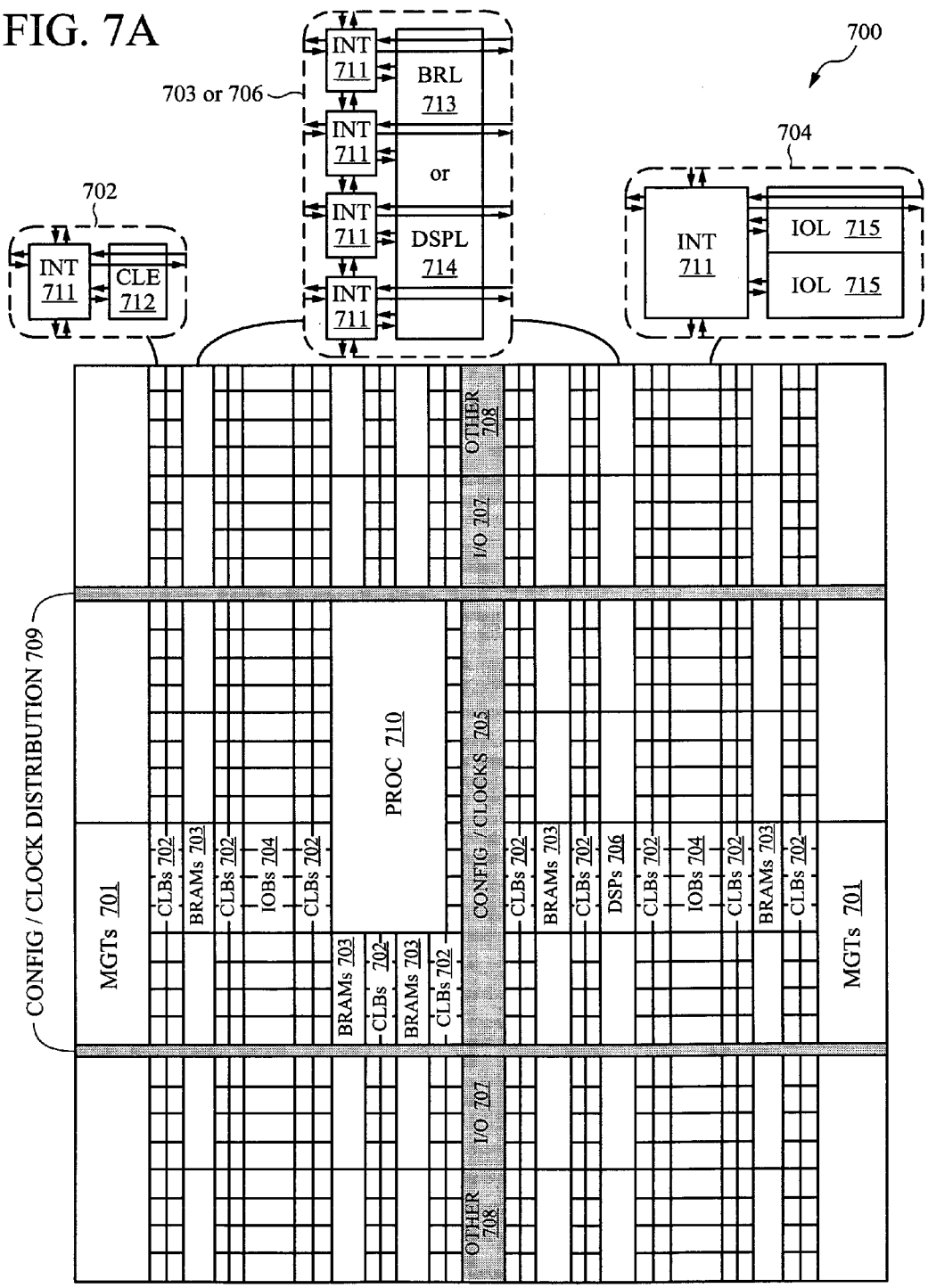
FIG. 7A is a plan view of an FPGA suitable for implementing embodiments of the invention.

FIG. 7A is a plan view of an FPGA 700 suitable for implementing embodiments of the invention. As noted above, advanced FPGAs can include several different types of programmable logic blocks in the array. For example, FIG. 7A illustrates an FPGA architecture that includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7A.

For example, a CLB 702 can include a configurable logic element (CLE 712) that can be programmed to implement user logic plus a single programmable interconnect element (INT 711). A BRAM 203 can include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element (INT 711). As will be clear to those of skill in the art, the actual I/O pads connected, for example, to the I/O logic element 715 are manufactured using metal layered above the various illustrated logic blocks, and typically are not confined to the area of the input/output logic element 715.

In the pictured embodiment, a columnar area near the center of the die (shown shaded in FIG. 7A) is used for configuration, clock, and other control logic. Horizontal areas 709 extending from this column are used to distribute the clocks and configuration signals across the breadth of the FPGA.

Some FPGAs utilizing the architecture illustrated in FIG. 7A include additional logic blocks that disrupt the regular columnar structure making up a large part of the FPGA. The additional logic blocks can be programmable blocks and/or dedicated logic. For example, the processor block PROC 710 shown in FIG. 7A spans several columns of CLBs and BRAMs.

Note that FIG. 7A is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7A are purely exemplary. For example, in an actual FPGA more than one adjacent column of CLBs is typically included wherever the CLBs appear, to facilitate the efficient implementation of user logic.

Figure 7B:
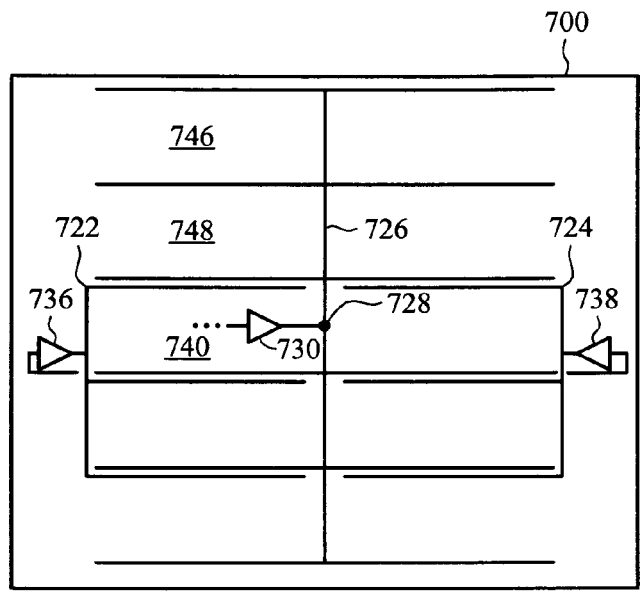
FIG. 7B is a simplified plan view of the FPGA of FIG. 7A illustrating clock trees.

FIG. 7B is a simplified plan view of the FPGA 700 of FIG. 7A illustrating clock trees. Regional clock trees 722, 724 are coupled to a symmetrical global clock tree 726 that is driven from a center point 728 by a global clock buffer 730. The first regional clock tree 722 is driven by a first regional clock buffer 736 and the second regional clock tree 724 is driven by a second regional clock buffer 738. Other regions 746, 748 of the FPGA 700 optionally have additional regional clock trees (not shown). An IOB (not shown) in a region 740 is selectively clocked by the regional clock signal or by the global clock signal, depending on the application loaded into the FPGA 700. A DCM (not shown) is selectively included in the global clock path and can provide variable phase skew to the global clock, but is not available for providing phase skew to the regional clock signal, unless the regional clock signal is brought back to through the global clock. Hence, the variable delay elements in the IOBs (refer to FIG. 4A, ref. nums. 426, 403, and FIG. 4B, ref. nums. 426' 419) enable providing a selected amount of delay to a regional clock signal.

Figure 8:
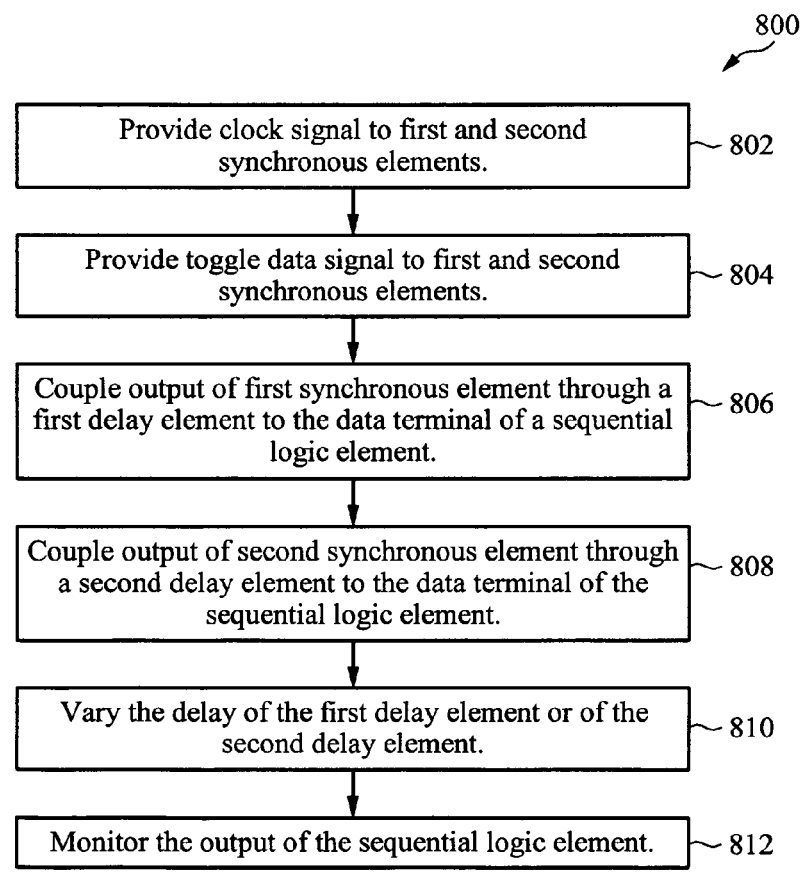
FIG. 8 is a flow chart of a method of measuring input set-up and hold time with an IOB delay element in a clock path, according to an embodiment of the invention.

FIG. 8 is a flow chart of a method of measuring input set-up and hold time 800 with an IOB delay element according to an embodiment of the invention. A clock signal is provided to a first synchronous element in a first IOB and to a second synchronous element in a second IOB (step 802). An alternating test signal is provided to the first synchronous element and to the second synchronous element (step 804). The output of the first synchronous element is coupled through a first delay element in the first IOB to a data terminal of a sequential logic element (step 806), and the output of the second synchronous element is coupled through a second delay element in the second IOB to a clock terminal of the sequential logic element (step 808). The delay of one of the first delay element and the second delay element is selectively varied (step 810) and the output of the sequential logic element is monitored (step 812) to determine whether the sequential logic element has captured the data value in the test signal.

In some embodiments, the first delay element is a static delay element providing a known static delay greater than a set-up and hold time for the sequential logic element when the output of the second synchronous element is routed from the second delay element to the clock input of the sequential element along a first path, and the second delay element is a variable delay line in the IOB. The delay provided by the variable delay line is increased until the sequential logic element first captures a data pulse. In a particular embodiment, a clock signal is provided to an IO port of the second IOB to step-wise sweep the delay of the variable delay line. In a further embodiment, after the data pulse has been captured, the delay provided by the variable delay line is decreased until the sequential logic element first fails to capture the data value. In alternative embodiments, the first delay element is a variable delay line, and the second delay element is a second variable delay line or a route through the second IOB that bypasses the second variable delay line.

While the present invention has been described in connection with specific embodiments, variations of these embodiments will be obvious to those of ordinary skill in the art. Therefore, the spirit and scope of the appended claims should not be limited to the foregoing description.

The invention claimed is:

1. A programmable logic device comprising:
   a first input-output block having
      a first synchronous element clocked by a clock signal and receiving a data test signal at a first data terminal of the first synchronous element,
      a first delay element, and
      a sequential logic element having a second data terminal, an output terminal, and a clock terminal, the data test signal being coupled to the second data terminal through the first delay element;
   a second input-output block having
      a second delay element, and
      a second synchronous element clocked by the clock signal and receiving the data test signal at a data terminal of the second synchronous element, the data test signal from the second synchronous element being coupled to the clock terminal of the sequential logic element through the second delay element; and
   a catch output port connected to the output terminal of the sequential logic element.

2. The programmable logic device of claim 1 wherein at least one of the first delay element and the second delay element is a selectively variable delay element.

3. The programmable logic device of claim 1 wherein the first delay element is a first selectively variable delay element and the second delay element is a second selectively variable delay element.

4. The programmable logic device of claim 1 wherein the programmable logic device is a field-programmable gate array.

5. The programmable logic device of claim 4 wherein the clock signal is a regional clock signal.

6. The programmable logic device of claim 4 further comprising logic configured in fabric of the field-programmable gate array to monitor the catch output port.

7. The programmable logic device of claim 4 wherein the data test signal is a divided global clock signal.

8. The programmable logic device of claim 1 wherein the data test signal is a second clock signal.

9. The programmable logic device of claim 1 wherein the first synchronous element is a first output flip-flop and the second synchronous element is a second output flip-flop.

10. A method for measuring set-up time of a sequential logic element on a programmable logic device comprising:
   programming the programmable logic device to establish the connections specified in claim 1;
   controlling the delay of at least one of the first delay element and the second delay element; and
   monitoring the output terminal of the delayed test clock signal.

11. A method for measuring set-up time of a sequential logic element on a programmable logic device comprising:
   providing a clock signal to a first synchronous element in a first input-output block and to a second synchronous element in a second input-output block;
   providing an alternating test signal to the first synchronous element and to the second synchronous element;
   coupling a first output of the first synchronous element through a first delay element in the first input-output block to a data terminal of a sequential logic element in the first input-output block;
   coupling a second output of the second synchronous element through a second delay element in the second input-output block to a clock terminal of the sequential logic element in the first input-output block;
   selectively varying a delay of one of the first delay element and the second delay element; and
   monitoring an output of the sequential logic element.

12. The method of claim 11 wherein the step of selectively varying the delay comprises increasing the delay.

13. The method of claim 11 wherein signals are provided to an input-output port of one of the first input-output block or the second input-output block to step-wise sweep the delay.

14. The method of claim 11 wherein the output of the sequential logic element is monitored to determine the delay at which a data pulse is first captured by the sequential logic element.

15. The method of claim 11 wherein the output of the sequential logic element is monitored to determine the delay at which a data pulse is last captured by the sequential logic element.

16. The method of claim 11 wherein the step of selectively varying the delay comprises stepping the delay in a first polarity until a first state transition is monitored on the output of the sequential logic element, and further comprising
   stepping the delay in a second polarity until a second state transition is monitored.

17. A system for measuring set-up and hold times of a sequential logic element of a programmable logic device comprising:
   means for providing a clock signal to a first synchronous logic element and to a second synchronous logic element
   means for providing an alternating test signal to the first synchronous logic element and to the second synchronous logic element; and
      means for selectively delaying, in an input-output block, one of a data signal and an input clock signal, the data signal being coupled to a data terminal of the sequential logic element and the input clock signal being coupled to a clock terminal of the sequential logic element.

* * * * *